(12) United States Patent
Shin et al.

(10) Patent No.: US 9,853,232 B2
(45) Date of Patent: Dec. 26, 2017

(54) ORGANIC LIGHT EMITTING DEVICE

(71) Applicant: LG DISPLAY CO., LTD., Seoul (KR)

(72) Inventors: Jeongkyun Shin, Paju-si (KR); Youngju Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/518,337

(22) Filed: Oct. 20, 2014

(65) Prior Publication Data
US 2015/0108456 A1    Apr. 23, 2015

(30) Foreign Application Priority Data

Oct. 23, 2013 (KR) .................. 10-2013-0126452

(51) Int. Cl.
*H01L 29/08* (2006.01)
*H01L 51/50* (2006.01)

(52) U.S. Cl.
CPC ...... *H01L 51/5044* (2013.01); *H01L 51/5056* (2013.01)

(58) Field of Classification Search
None
See application file for complete search history.

(56) References Cited

U.S. PATENT DOCUMENTS

| 2005/0249972 | A1 | 11/2005 | Hatwar et al. |
| 2005/0253503 | A1* | 11/2005 | Stegamat ............ H01L 51/5048 313/504 |
| 2012/0223633 | A1* | 9/2012 | Yoshinaga .......... H01L 27/3211 313/504 |

FOREIGN PATENT DOCUMENTS

| CN | 102082240 A | 6/2011 |
| CN | 102222682 A | 10/2011 |
| CN | 102655164 A | 9/2012 |

OTHER PUBLICATIONS

Matsumoto, et al.: 62.1: "High-Performance Solution-Processes OLED Enhanced by Evaporated Common Layer", SID, 2011, pp. 924-927.

* cited by examiner

*Primary Examiner* — Cory Eskridge
(74) *Attorney, Agent, or Firm* — Dentons US LLP

(57) ABSTRACT

Disclosed is an organic light emitting device that may include a substrate having first to third light emitting parts; a first electrode in each of the first to third light emitting parts; a hole transport layer on the first electrode; first and second light emitting layers on the hole transport layer in the first and second light emitting parts, respectively; a common third light emitting layer on the first and second light emitting layers; a hole connection layer including a bipolar material and an electron transport material, wherein the hole connection layer in the first and second light emitting parts is provided between the common third light emitting layer and the first and second light emitting layers, and the hole connection layer in the third light emitting part is provided between the common third light emitting layer and the hole transport layer; a second electrode on the common third light emitting layer.

18 Claims, 5 Drawing Sheets

ORGANIC LIGHT EMITTING DEVICE

This application claims the benefit of Korean Patent Application No. 10-2013-0126452, filed on Oct. 23, 2013, which is hereby incorporated by reference for all purposes as if fully set forth herein.

BACKGROUND OF THE INVENTION

Field of the Invention

The present invention relates to an organic light emitting device, and more specifically, to an organic light emitting device including a hole connection layer between light emitting layers and method for manufacturing the same.

Discussion of the Related Art

An organic light emitting device (hereinafter, referred to as OLED) is an electronic device that emits light in response to an applied potential. The structure of the OLED typically includes an anode, an organic EL medium, and a cathode, in sequence. Generally, the organic EL medium provided between the anode and the cathode includes an organic hole transport layer (HTL) and an electron transport layer (ETL). Holes and electrons are recombined to emit light in the ETL near the interface of HTL/ETL. Tang, et al. demonstrated a very effective OLED using such a layer structure in "Organic Electroluminescent Diodes," Applied Physics Letters, 51, 913 (1987) and in commonly assigned U.S. Pat. No. 4,769,292.

In addition, as disclosed in Adachi et al., "Electroluminescence in Organic Films with Three-Layer Structure," Japanese Journal of Applied Physics, 27, L269 (1988) and Tang et al., "Electroluminescence of Doped Organic Thin Films," Journal of Applied Physics, 65, 3610 (1989), there is a three-layer type OLED including an organic light emitting layer (hereinafter, referred to as LEL) between HTL and ETL. Generally, LEL contains a host material doped with a guest material. In addition, there are other multilayer-type OLEDs including additional functional layers, such as a hole injection layer (hereinafter, referred to as HIL), and/or an electron injection layer (herein, referred to as EIL), and/or an electron blocking layer (EBL), and/or a hole blocking layer (HBL). At the same time, various types of EL materials are synthesized, and then used for an OLED. These novel structures and novel materials further improve the device performance.

Meanwhile, a soluble hybrid OLED device for a soluble type process is disclosed in Tomoyuki Higo, et al. "A High-Performance Hybrid OLED Device Assisted by Evaporated Common Organic Layers," IDW '311 (2010). Referring to FIG. 1, for large-area processing, HIL, HTL and LEL(R, G) are patterned on an anode through a soluble process, and a hole connection layer, a blue common layer (Blue (B)), ETL, EIL and a cathode are formed through vacuum thermal evaporation (VTE), without masks.

The charge balance of respective R, G, and B elements needs to be optimized for optimizing the lifetime and improving the color coordinates of the OLED device, but the optimization of the charge balance is not easy to implement in the above-described structure in which HTL, the hole connection layer, the blue common layer, ETL, and EIL are commonly used.

When the charge balance is not optimized, charges may accumulate in any one interface to induce the exciton quenching, causing a problem in the stability of the OLED device. Currently, in the red and green soluble hybrid OLED device having a bipolar hole connection layer, holes may accumulate in the interface between a light emitting layer and a hole connection layer to induce a charge accumulation phenomenon, causing a bad influence on the lifetime of the OLED device, and the deep blue wavelengths limited in the hole connection layer may degrade the color characteristics of the OLED device.

SUMMARY OF THE INVENTION

Accordingly, the present invention is directed to an organic light emitting device and method for manufacturing the same that substantially obviates one or more of the problems due to limitations and disadvantages of the related art.

An advantage of the present invention is to provide an organic light emitting device with improved characteristics of light emission.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, an organic light emitting device may, for example, include a substrate having first to third light emitting parts; a first electrode in each of the first to third light emitting parts; a hole transport layer on the first electrode; first and second light emitting layers on the hole transport layer in the first and second light emitting parts, respectively; a common third light emitting layer on the first and second light emitting layers; a hole connection layer including a bipolar material and an electron transport material, wherein the hole connection layer in the first and second light emitting parts is provided between the common third light emitting layer and the first and second light emitting layers, and the hole connection layer in the third light emitting part is provided between the common third light emitting layer and the hole transport layer; a second electrode on the common third light emitting layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Reference will now be made in detail to embodiments of the invention, examples of which are illustrated in the accompanying drawings. Wherever possible, the same reference numbers may be used throughout the drawings to refer to the same or like parts.

Figure 1:
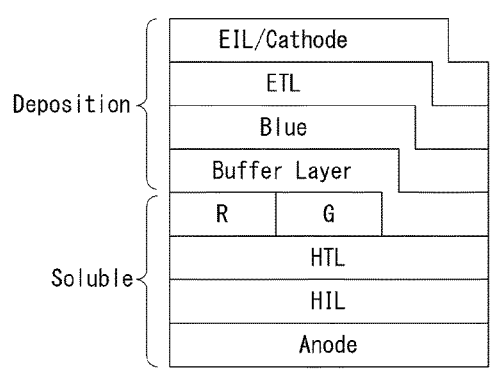
FIG. 1 is a cross-sectional view showing an organic light emitting device according to the related art.
Figure 2:
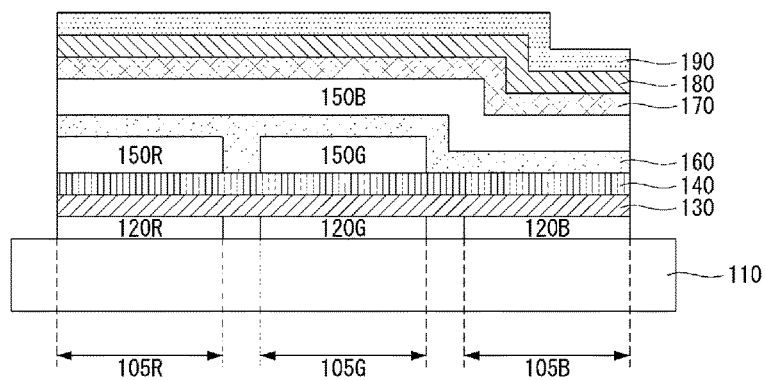
FIG. 2 is a view illustrating an organic light emitting device according to an embodiment of the present invention.
Figure 3:
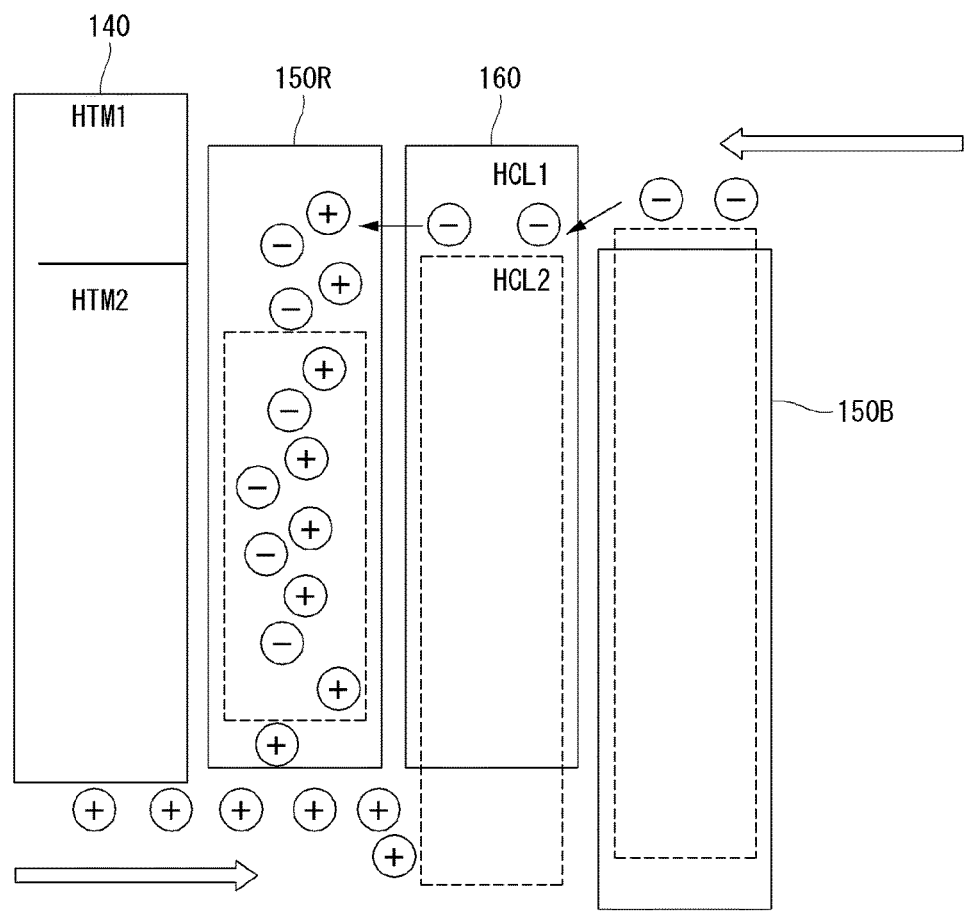
FIG. 3 is a diagram illustrating an energy band of an organic light emitting device according to an embodiment of the present invention.
Figure 4:
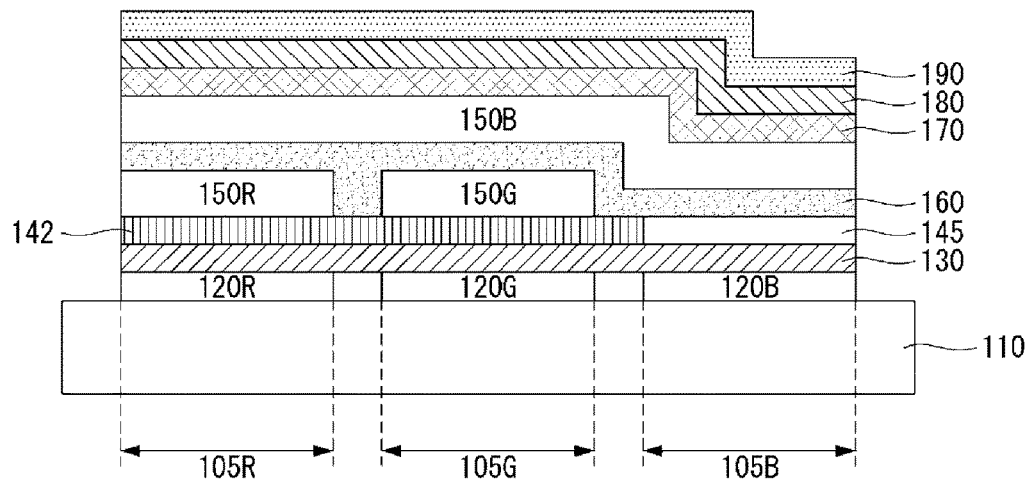
FIG. 4 is a view illustrating an organic light emitting device according to another embodiment of the present invention.

FIG. 2 is a view illustrating an organic light emitting device according to an embodiment of the present invention; FIG. 3 is a diagram illustrating an energy band of an organic light emitting device according to an embodiment of the present invention; and FIG. 4 is a view illustrating an organic light emitting device according to another embodiment of the present invention.

Referring to FIG. 2, an organic light emitting device 100 according to an embodiment of the present invention may be an organic light emitting device emitting red, green, and blue light wavelengths. In the present embodiment, three sub-pixels constitute one unit pixel, and the three sub-pixels include a red light emitting part 105R which emits a red light, a green light emitting part 105G which emits a green light, and a blue light emitting part 105B which emits a blue light, thereby capable of displaying full colors. The organic light emitting device 100 further includes a first light emitting layer 150R, a second light emitting layer 150G, and a third light emitting layer 150B between first electrodes 120R, 120G, and 120B on a substrate 110 and a second electrode 190.

More specifically, the substrate 110 may be formed of transparent glass, plastic, or other conductive material, through which light passes. The first electrodes 120R, 120G, and 120B are formed on the substrate 110 for the red light emitting part 105R, the green light emitting part 105G, and the blue light emitting part 105B, respectively. The first electrodes 120R, 120G, and 120B are a transparent anode having a high work function, and may be formed of any one of indium tin oxide (ITO), indium zinc oxide (IZO), or zinc oxide (ZnO). A second electrode 190 is a cathode having a low work function, and may be formed of a metal material, such as aluminum (Al), magnesium (Mg), silver (Ag), or calcium (Ca).

The three red, green, and blue light emitting parts 105R, 105G, and 105B constitute a one light emission unit. The red light emitting part 105R includes the first light emitting layer 150R emitting a red light, and the green light emitting part 105G includes the second light emitting layer 150G emitting a green light. In addition, the third light emitting layer 150B emitting a blue light is commonly formed in the red, green and blue light emitting parts 105R, 105G, and 105B.

The first light emitting layer 150R emits a red light, and may be, for example, formed of at least one host selected from CBP (4,4'-N,N'-dicarbazolebiphenyl) and Balq (Bis(2-methyl-8-quinlinolato-N1,O8)-(1,1'-Biphenyl-4-olato)aluminium) and at least one red phosphorescent dopant selected from Ir(Mnpy)3, Btp2Ir(acac)(bis(2O-benzo[4,5-a]thienyl)pyridinato-N,C3O)iridium(zcetylactonate), and Btp2Ir (acac)(iridium(III)bis(1-phenylisoquinolyl)-N,C2')acetyl.

The second light emitting layer 150G emits a green light, and may be, for example, formed of at least one host selected from CBP (4,4'-N,N'-dicarbazolebiphenyl) and Balq (Bis(2-methyl-8-quinlinolato-N1,O8)-(1,1'-Biphenyl-4-olato)aluminium) and a green phosphorescent dopant of Ir(ppy)$_3$.

The third light emitting layer 150B is provided above the first light emitting layer 150R and the second light emitting layer 150G of the red light emitting part 105R and the green light emitting part 105G, and also provided in in the blue light emitting part 105B. The third light emitting layer 150B emits a blue light, and may be, for example, formed of a host material of ADN (9,10-di(2-naphthyl)anthracene) or DPVBi (4,4'-bis(2,2-diphenylethen-1-yl)-diphenyl) and a blue fluorescent dopant of 1,6-Bis(diphenylamine)pyrene or TBPe (tetrakis(t-butyl)perylene), a deep blue dopant of DPA-TP (4'-N,N-diphenylaminostyryl-triphenyl), TSB (2,5,2',5'-tetrastyryl-biphenyl), or an anthracene derivative, or a sky blue dopant of p-bis(p-N,N-diphenyl-aminostyryl)benzene or phenylcyclopentadiene.

As described above, the third light emitting layer 150B is provided above the first light emitting layer 150R of the red light emitting part 105R and the second light emitting layer 150G of the red light emitting part 105, and is commonly provided in the blue light emitting part 105B. In the third light emitting layer 150B of the blue light emitting part 105B, an energy of the host is transferred to the dopant to emit a blue light. However, in the third light emitting layer 150B in the red and green light emitting parts 105R and 105G, an energy of the host is substantially not transferred to the dopant, but is transferred to the dopants of the first light emitting layer 150R and the second light emitting layer 150G having smaller energy level differences, so that the third light emitting layer 150B in the red and green light emitting parts 105R and 105G substantially does not emit light but serves to transfer energy.

Meanwhile, a hole injection layer (HIL) 130 is provided between the first electrode 120R and the first light emitting layer 150R in the red light emitting part 105R, between the first electrode 120G and the second light emitting layer 150G in the green light emitting part 105G, and between the first electrode 120B and the third light emitting layer 150B in the blue light emitting part 105B. The hole injection layer 130 may serve to facilitate the injection of holes into the first to third light emitting layers 150R, 150G, 150B from the first electrodes 120R, 120G, 120B, and may be formed of at least one selected from the group consisting of CuPc (cupper phthalocyanine), PEDOT (poly(3,4)-ethylenedioxythiophene), PANI (polyaniline), and NPD (N,N-dinaphthyl-N, N'-diphenyl benzidine), but is not limited thereto.

In addition, the organic light emitting device further includes an electron transport layer (ETL) 170 and an electron injection layer 180 formed on the third light emitting layer 150B in the red light emitting part 105R, the green light emitting part 105G, and the blue light emitting part 105B. The electron transport layer 170 may serve to facilitate the transport of electrons, and may be formed of at least one selected from the group consisting of Alq3 (tris(8-hydroxyquinolino)aluminum), PBD, TAZ, spiro-PBD, BAlq, and SAlq, but is not limited thereto. In addition, the electron injection layer 180 may serve to facilitate the injection of electrons, and may be formed of at least one selected from the group consisting of LiF, Li, Ba, and BaF2, but is not limited thereto.

Meanwhile, the organic light emitting device also includes a hole transport layer 140 between the hole injection layer 130 and the light emitting layers 150R, 150G, and 150B. The hole transport layer 140 may serve to transport holes from the first electrodes 120R, 120G, and 120B to the respective light emitting layers, and may contain at least two materials. For example, the hole transport layer 140 may contain a first hole transport material and a second hole transport material. The second hole transport material has generally a higher level of ΔT1 than that of the first hole transport material, and ΔT1 of the second hole transport material is within a range of about 2.0 to about 2.7 eV. As a result, a triplet energy level of the light emitting layers 150R, 150G, and 150B is lower than that of the hole transport layer 140, thereby reducing or preventing an energy transfer from the light emitting layers 150R, 150G, and 150B to the hole transport layer 140.

Examples of the second hole transport material having ΔT1 of about 2.0 to about 2.7 eV are carbazole-based material, an aryl silane-based material, a phosphine oxide-based material, and the like. In addition, the second hole transport material has a high glass transition temperature (Tg), and thus forms radicals due to high thermal stability at the time of cross-linking of the hole transport layer 140 and the light emitting layers 150R, 150G, and 150B. The glass transition temperature (Tg) of the hole transport layer 140 having a level of ΔT1 is about 100 to about 250° C. to improve crosslinkability, A level of ΔT1 of the first hole transport material is about 1.6 to about 2.2 eV, which is generally lower than that of the second hole transport material. In addition, a hole mobility of the first hole transport material is about 1.0 E-04 to about 5.0 E-01 $cm^2/Vs$, and a hole mobility of the second hole transport material is equal to or lower than that of the first hole transport material.

As a result, the hole transport layer 140 according to an embodiment of the present invention has a higher level of ΔT1 than that of the conventional hole transport layer and a lower mobility of holes, thereby shifting the recombination zones of the red and green light emitting layers 150R and 150G, which are located in interfaces between the light emitting layers 150R and 150G and a hole connection layer 160, to a center of each light emitting layer. This may lead to improvement in the lifetime and the color coordinates of the OLED device.

As illustrated in FIG. 2, the organic light emitting device further includes the hole connection layer 160 between the third light emitting layer 150B and the first and second light emitting layers 150R and 150G, and between the third light emitting layer 150B and the hole transport layer 140 in the blue light emitting part 105B. The hole connection layer 160 serves to improve efficiency of the blue light emitted from the common third light emitting layer 150B and the color coordinate characteristics, and also serves to effectively inject the electrons of the third light emitting layer 150B to the first light emitting layer 150R for a red color and the second light emitting layer 150G for a green color, thereby improving the lifetime of the OLED device.

The hole connection layer 160 may inject and move electrons and holes to the first light emitting layer 150R, the second light emitting layer 150G and the third light emitting layer 150B, and thus beneficially has a bipolar property. As for the first light emitting layer 150R and the second light emitting layer 150G, the holes are relatively fast and thus accumulate in interfaces of the first light emitting layer 150R and the second light emitting layer 150G and the hole connection layer 160. This may cause a safety problem of the OLED device due to an exciton quenching phenomenon, which may negatively affect color purity due to a peak emission of the hole connection layer 160.

To improve hole block and electron injection characteristics of the hole connection layer 160, an electron transport material having a highest occupied molecular orbital (HOMO) and a lowest unoccupied molecular orbital (LUMO) lower than those of the hole connection layer 160 is co-evaporated , thereby optimizing the recombination zones of the first light emitting layer 150R and the second light emitting layer 150G. This may also lead to improvement in the lifetime of the OLED device.

The hole connection layer 160 contains a bipolar material capable of transporting electrons and holes, and an electron transport material. The HOMO level and the LUMO level of the bipolar material are about −5.3 to about −6.3 eV and about −2.2 to about −3.2 eV, respectively, and the HOMO level and the LUMO level of the electron transport material are lower than those of the bipolar material. In addition, an electron mobility and a hole mobility of the bipolar material are about 1.0 E-09 to about 1.0 E-05 $cm^2/Vs$ and about 5.0 E-05 to about 5.0 E-03 $cm^2/Vs$, respectively, and the electron mobility and the hole mobility of the electron transport material are equal to or lower than those of the bipolar material. The HOMO level and the LUMO level of the electron transport material are lower than those of the bipolar material, which may facilitate movement of the electrons that are transferred from the third light emitting layer 150B to the first light emitting layer 150R and the second light emitting layer 150G.

A thickness of the hole connection layer 160 may be about 50 to about 10,000 Å. This thickness is for improving or optimizing the charge balance between the electron transport layer 180 and the hole transport layer 140, and is designed to induce an emission of light in an interface between the first and second light emitting layers 150R and 150G and the hole connection layer 160. In addition, the hole connection layer 160 is formed by vacuum deposition, and the bipolar material and the electron transport material may be formed by co-evaporation.

Referring to FIG. 3, the organic light emitting device according to an embodiment of the present invention described as above includes a hole transport layer 140 containing a first hole transport material HTM1 and a second hole transport material HTM2, a first or second light emitting layer (hereafter, the description is made based on the first light emitting layer), a hole connection layer 160 containing a bipolar material HCL1 and an electron transport material HCL2, and a third light emitting layer 150B. Because the hole transport layer 140 contains the second hole transport material HTM2 having a higher level of ΔT1 than that of the first hole transport material HTM1, the first light emitting layer 150R has a lower level of ΔT1 than that of the hole transport layer 140, thereby reducing or preventing an energy transfer from the first light emitting layer 150R to the hole transport layer 140. In addition, because the hole mobility of the second hole transport material HTM2 is lower that of the first hole transport material HTM1 in the hole transport layer 140, the hole mobility can be controlled.

Because the hole connection layer 160 contains the electron transport material HCL2 having lower HOMO and LUMO levels than those of the bipolar material HCL1, an energy gap of the electrons injected into the hole connection layer 160 from the third light emitting layer 150B is reduced to facilitate injection of electrons. As a result, the recombination zones of the first and second light emitting layers 150R and 150G for red and green colors are shifted to centers of these light emitting layers 150R and 150G, thereby improving the efficiency of light emission and the color characteristics.

All of the hole injection layer 130, the hole transport layer 140, and the first and second light emitting layers 150R and 150G described as above may be formed by a solution coating method, such as spin coating, dip coating, or inkjet printing.

Referring to FIG. 4, an organic light emitting device according to another embodiment of the present invention includes a first hole transport layer 142 in red and green light emitting parts 105R and 105G, and a second hole transport layer 145 in a blue light emitting part 105B. The first hole transport layer 142 and the second hole transport layer 145 are formed of different materials. The first hole transport layer 142 may have the same constitution as the hole transport layer 140 illustrated in FIG. 2, and may be formed of a first hole transport material and a second hole transport material. In addition, the second hole transport layer 145 may be formed of only the first hole transport material.

The first hole transport layer 142 is provided in the red and green light emitting parts 105R and 105G, and the second hole transport layer 145 is provided in the blue light emitting part 105B. As a result, in the red and green light emitting parts 105R and 105G, the recombination zones may be shifted to locations inside the first and second light emitting layers 150R and 150G. Meanwhile, the second hole transport layer 145 substantially free from the second hole transport material is provided in the blue light emitting part 105B. That is, the holes injected from the first electrode 120B can be easily injected into the third light emitting layer 150B substantially without a decrease in the hole mobility in the second hole transport layer 145. As a result, in the blue light emitting part 105B, the recombination zone of holes and electrons can be positioned inside the third light emitting layer 150B away from the hole connection layer 160. The first hole transport layer 142 and the second hole transport layer 145, which have different constituent materials in the respective light emitting parts 105R, 105G, and 105B, may be formed by a solution coating method.

Hereinafter, exemplary devices according to embodiments of the present invention will now be described. However, the following examples are merely for illustrative purposes, but are not intended to limit the scope of the present invention.

COMPARATIVE EXAMPLE

ITO glass having a sheet resistance of 30Ω, a thickness of 1.08 mm, and a light transmittance of 80% or more was cut into a size of 2 cm×2 cm, and then a part of the ITO layer was removed using an liquid etchant. In addition, the ITO glass was washed with acetone, methanol, and IPA for about 15 minutes for each material by using an ultrasonic cleaner, and then washed with ionic water, followed by drying through annealing at 230° C. for about 30 minutes. A hole injection layer was formed to have a thickness of 50 Å by using CuPc, and a hole injection layer was formed to have a thickness of 700 Å by using NPD. A red light emitting layer was formed to have a thickness of 300 Å by mixing a dopant of Ir(Mnpy)3 with a host material CBP, and a green light emitting layer was formed to have a thickness of 300 Å by mixing a dopant of Ir(ppy)3 with a host material CBP. The above-described hole injection layer, hole transport layer, red light emitting layer and green light emitting layer were formed by performing spin coating and drying at 110° C. for about 1 hour. After the green light emitting layer was coated by the solution process, a hole connection layer was formed to have a thickness of 200 Å by using a material having an HOMO level of −5.3 to −6.3 eV and an LUMO level of −2.2 to −3.2 eV, and a blue common light emitting layer was formed to have a thickness of 300 Å by mixing a dopant of spiro-DPVBi with a host material CBP. An electron transport layer was formed to have a thickness of 200 Å by using Alq3, an electron injection layer was formed to have a thickness of 10 Å by using LiF, and a second electrode was formed to have a thickness of 1000 Å by using Al, thereby manufacturing a blue, green, and red organic light emitting device.

EXAMPLES

A blue, green, and red organic light emitting device was manufactured under the same process conditions as in the above-described comparative example, except that a hole transport layer was formed to have a thickness of 700 Å by mixing a first hole transport material having a level of ΔT1 within a range of 1.6 to 2.2 and a second hole transport material having a level of ΔT1 within a range of 2.0 to 2.7, and a hole connection layer was formed to have a thickness of 200 Å by mixing a bipolar material having an HOMO level of −5.3 to −6.3 eV and an LUMO level of −2.2 to −3.2 eV and an electron transport material having lower HOMO and LUMO levels than those of the bipolar material.

Figure 5A:
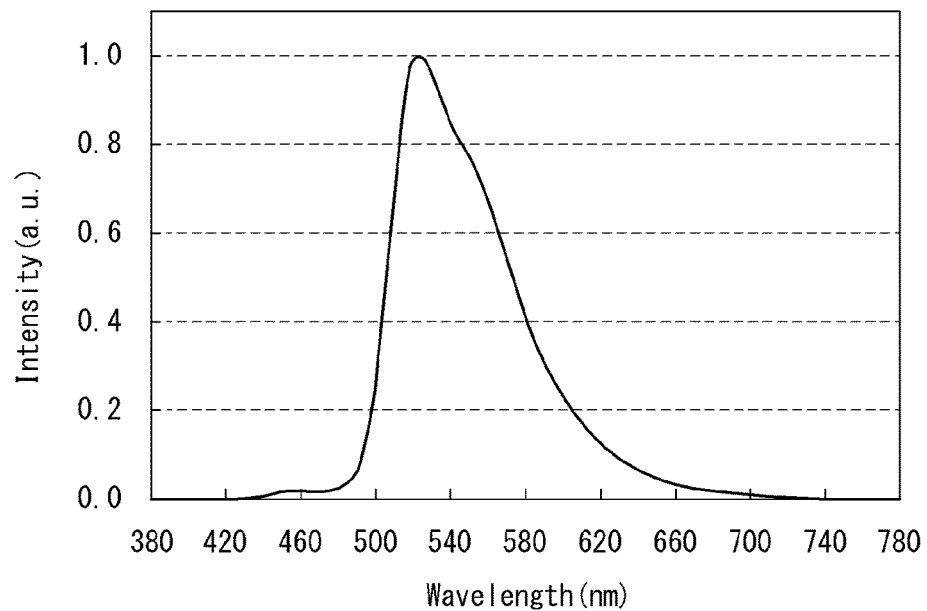
FIG. 5A shows a green spectrum of an organic light emitting device of a comparative example.
Figure 5B:
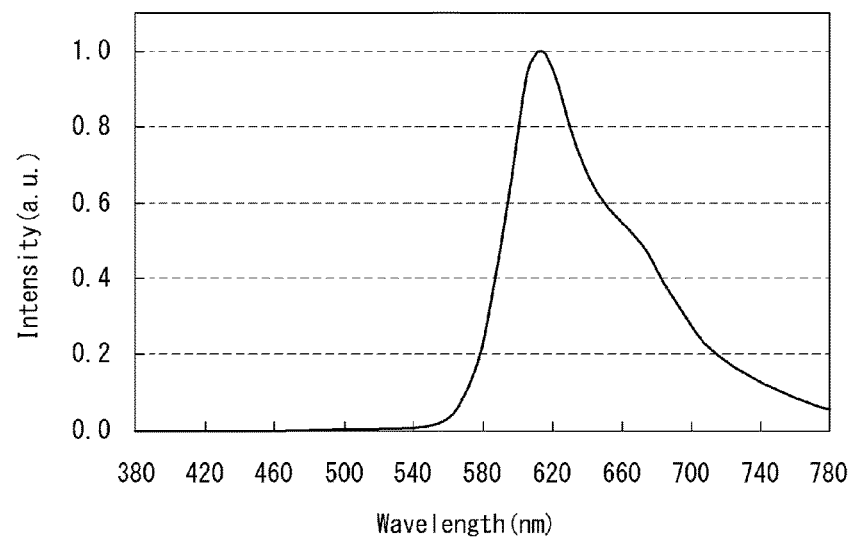
FIG. 5B shows a red spectrum of an organic light emitting device of a comparative example.
Figure 6A:
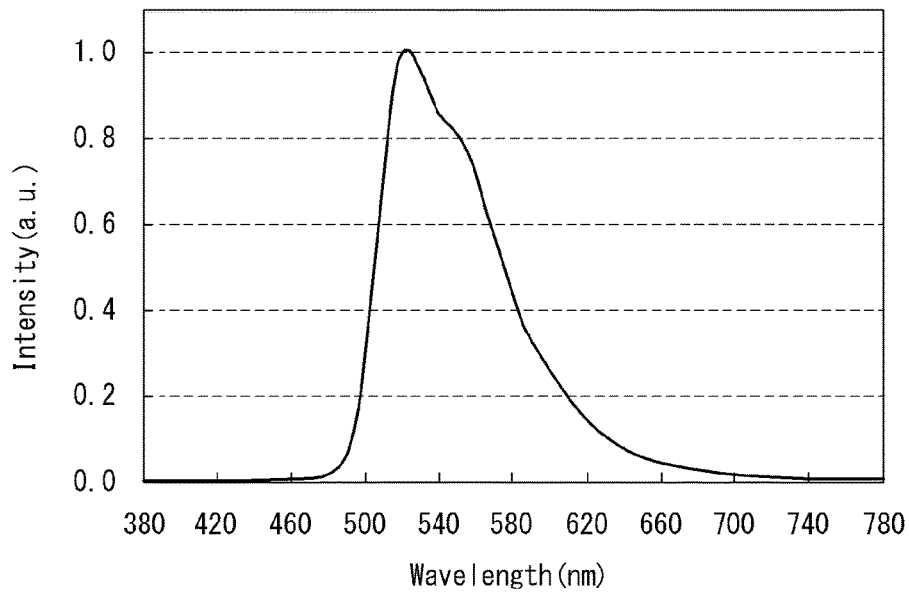
FIG. 6A shows a green spectrum of an organic light emitting device according to an embodiment of the present invention.
Figure 6B:
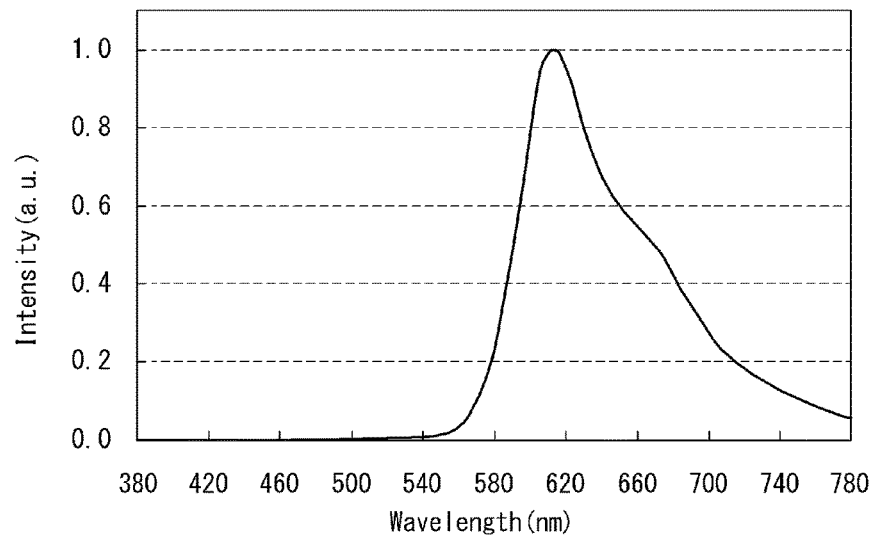
FIG. 6B shows a red spectrum of an organic light emitting device according to an embodiment of the present invention.

The green and red spectra of the organic light emitting devices manufactured according to the comparative example and the example were respectively measured, which are shown in FIG. 5A to FIG. 6B. In particular, FIG. 5A shows a green spectrum of the comparative example, FIG. 5B shows a red spectrum of the comparative example, FIG. 6A shows a green spectrum of the example, and FIG. 6B shows a red spectrum of the example. In addition, the driving voltage, quantum efficiency, efficiency of light emission, color coordinates, and lifetime of the green and red elements of the organic light emitting devices manufactured according to the comparative example and the example were measured, which are shown in table 1 below. The lifetime characteristics thereof are also shown in the graph of FIG. 7.

TABLE 1

| # | Color | driving voltage (V) | quantum efficiency (%) | efficiency of light emission (Cd/A) | color coordinates CIE_x | CIE_y | Lifetime (T95) |
|---|---|---|---|---|---|---|---|
| comparative example | Green | 4.1 | 16.6 | 61.7 | 0.325 | 0.621 | 2.3 |
| | Red | 4.7 | 9.2 | 11.2 | 0.645 | 0.354 | 5.8 |
| example | Green | 4.7 | 18.1 | 67.5 | 0.334 | 0.624 | 9.8 |
| | Red | 5.0 | 12.7 | 15.2 | 0.646 | 0.353 | 13.1 |

Figure 7:
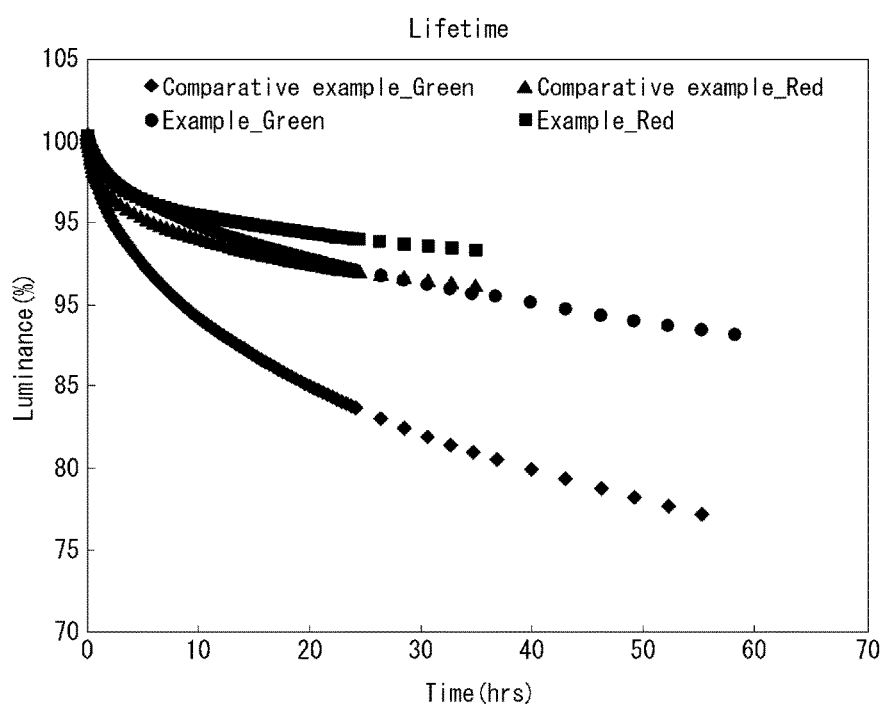
FIG. 7 is a graph showing the lifetime of organic light emitting devices according to a comparative example and an embodiment of the present invention.

As shown in Table 1 and FIG. 7, the quantum efficiency, efficiency of light emission, color coordinates, and lifetime were further improved in the organic light emitting device manufactured according to the example of the present invention as compared to the organic light emitting device manufactured according to the comparative example. In addition, as for the green spectrum of the comparative example shown in FIG. 5A, a peak of the hole connection layer was observed near the wavelength of about 460 nm, but as for the green spectrum of the example shown in FIG. 6A, such a peak of the hole connection layer was not observed. That is, the appearance of the peak of the hole connection layer as in the comparative example may mean that the light emitting recombination zone is formed in the interface between the light emitting layer and the hole connection layer. As for the organic light emitting device according to the example of the present invention, the recombination zone is believe to be shifted into inside the light emitting layer away from the hole connection layer, leading to an improvement in color coordinates.

As described above, in the organic light emitting device according to an embodiment of the present invention, the recombination zones of the red and green light emitting layers may be shifted to locations inside (e.g., centers of) the light emitting layers away from the interfaces between the light emitting layers and the hole connection layer by providing a hole transport layer having a higher level of $\Delta T1$ and a lower mobility of holes. Further, a hole connection layer, which contains an electron transport material having low HOMO and LUMO levels than those of the bipolar material, may reduce an energy gap of the electrons injected into the hole connection layer from the blue light emitting layer, thereby facilitating injection of electrons. In an organic light emitting device according to an embodiment of the present invention, the efficiency of light emission, lifetime, and color coordinates may be improved by shifting the recombination zones of the red and green light emitting layers to locations inside the red and green light emitting layers.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic light emitting display (OLED) device, comprising:
    a substrate having first to third light emitting parts;
    a first electrode in each of the first to third light emitting parts;
    a hole injection layer on the first electrode;
    a hole transport layer on the hole injection layer;
    first and second light emitting layers on the hole transport layer in the first and second light emitting parts, respectively;
    a common third light emitting layer on the first and second light emitting layers;
    a hole connection layer including a bipolar material and an electron transport material, the electron transport material improving hole block and electron injection characteristics of the hole connection layer,
    wherein the hole connection layer in the first and second light emitting parts is provided between the common third light emitting layer and the first and second light emitting layers, and the hole connection layer in the third light emitting part is provided between the common third light emitting layer and the hole transport layer; and
    a second electrode on the common third light emitting layer,
    wherein the hole transport layer in the first and second light emitting parts includes a first hole transport material and a second hole transport material different from the first hole transport material, and wherein a hole mobility of the second hole transport material is equal to or smaller than that of the first hole transport material, and
    wherein HOMO and LUMO levels of the electron transport material are lower than those of the bipolar material, and the hole connection layer reduces an energy gap of electrons injected into the hole connection layer to facilitate the injection of the electrons into the hole connection layer from the third light emitting layer.

2. The OLED device of claim 1, wherein the bipolar material transports both electrons and holes.

3. The OLED device of claim 1, further comprising an electron injection layer on the common third light emitting layer.

4. The OLED device of claim 1, wherein the hole transport layer in the third light emitting part includes the first hole transport material and is substantially free from the second hole transport material.

5. The OLED device of claim 1, wherein the hole transport layer in the third light emitting part includes the first and second hole transport materials.

6. The OLED device of claim 1, wherein a level of $\Delta T1$ of the first hole transport material is in a range of about 1.6 eV to about 2.2 eV, and a level of $\Delta T1$ of the second hole transport material is in a range of about 2.0 eV to about 2.7 eV.

7. The OLED device of claim 6, wherein the second hole transport material includes at least one of a carbazole-based material, an aryl silane-based material, or a phosphine oxide-based material.

8. The OLED device of claim 1, wherein a glass transition temperature of wherein the second hole transport material is in a range of about 100° C. to about 250° C.

9. The OLED device of claim 1, wherein the hole mobility of the first hole transport material is in a range of about 1.0 E-04 cm$^2$/Vs to about 5.0 E-01 cm$^2$/Vs.

10. The OLED device of claim 1, wherein the bipolar material has an HOMO level of about −5.3 eV to about −6.3 eV and an LUMO level of about −2.2 eV to about −3.2 eV.

11. The OLED device of claim 1, wherein the bipolar material has an electron mobility of about 1.0 E-09 cm$^2$/Vs to about 1.0 E-05 cm$^2$/Vs and a hole mobility of about 5.0 E-05 cm$^2$/Vs to about 5.0 E-03 cm$^2$/Vs.

12. The OLED device of claim 1, wherein a thickness of the hole connection layer is in a range of about 50 Å to about 10000 Å.

13. The OLED device of claim 1, wherein the hole connection layer is formed by co-evaporating the bipolar material and the electron transport material.

14. The OLED device of claim 1, wherein the first light emitting layer has a lower level of $\Delta T1$ that that of the hole transport layer.

15. The OLED device of claim 1, wherein the common third light emitting layer emits a blue light, and the first and second light emitting layers emit a red light and a green light, respectively.

16. The OLED device of claim 15, wherein the green light emitted from the second light emitting layer substantially lacks a peak at a wavelength of about 460 nm.

17. The OLED device of claim 7, wherein the common third light emitting layer includes a host material of ADN (9,10-di(2-naphthyl)anthracene) or DPVBi (4,4'-bis(2,2-diphenylethen-1-yl)-diphenyl).

18. The OLED device of claim 17, wherein the common third light emitting layer further includes a blue fluorescent dopant of 1,6-Bis(diphenylamine)pyrene or TBPe (tetrakis(t-butyl)perylene), a deep blue dopant of DPA-TP (4'-N,N-diphenylaminostyryl-triphenyl), TSB (2,5,2',5'-tetrastyryl-biphenyl), or an anthracene derivative, or a sky blue dopant of p-bis(p-N,N-diphenyl-aminostyryl)benzene or phenylcyclopentadiene.

\* \* \* \* \*